(12) United States Patent
Wenxu et al.

(10) Patent No.: US 9,337,029 B2
(45) Date of Patent: May 10, 2016

(54) STRUCTURE INCLUDING GALLIUM NITRIDE SUBSTRATE AND METHOD OF MANUFACTURING THE GALLIUM NITRIDE SUBSTRATE

(71) Applicant: Samsung Electronics Co., Ltd., Suwon-si, Gyeonggi-do (KR)

(72) Inventors: Xianyu Wenxu, Suwon-si (KR); Yeon-hee Kim, Seoul (KR); Chang-youl Moon, Suwon-si (KR); Yong-young Park, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/682,820

(22) Filed: Apr. 9, 2015

(65) Prior Publication Data

US 2015/0214037 A1 Jul. 30, 2015

Related U.S. Application Data

(62) Division of application No. 13/848,281, filed on Mar. 21, 2013, now Pat. No. 9,029,860.

(30) Foreign Application Priority Data

Oct. 23, 2012 (KR) .................. 10-2012-0117914

(51) Int. Cl.
*H01L 21/302* (2006.01)
*H01L 21/02* (2006.01)
(Continued)

(52) U.S. Cl.
CPC ........ *H01L 21/0254* (2013.01); *H01L 21/0243* (2013.01); *H01L 21/0245* (2013.01); *H01L 21/0262* (2013.01); *H01L 21/02164* (2013.01); *H01L 21/02238* (2013.01); *H01L 21/02381* (2013.01); *H01L 21/02458* (2013.01);
(Continued)

(58) Field of Classification Search
CPC ................ H01L 21/0254; H01L 21/02381; H01L 21/02532; H01L 23/49; H01L 23/585; H01L 25/073
USPC ........................... 438/695, 697, 705
See application file for complete search history.

(56) References Cited

U.S. PATENT DOCUMENTS 7,358,160 B2 4/2008 Li et al.
7,621,998 B2 11/2009 Lee et al.
(Continued)

FOREIGN PATENT DOCUMENTS

KR 20010038505 A 5/2001
KR 20040008523 A 1/2004
(Continued)

OTHER PUBLICATIONS

Puneet Srivastava, et al., "Significant enhancement of breakdown voltage for GaN DHFETs by Si substrate removal", Phys. Status Solidi C 8, No. 7-8, pp. 2216-2218 (2011) DOI 10.1002/pssc.201001023;.

(Continued)

*Primary Examiner* — Tan N Tran
(74) *Attorney, Agent, or Firm* — Harness, Dickey & Pierce, P.L.C.

(57) ABSTRACT

A structure includes a silicon substrate, a plurality of silicon rods on the silicon substrate, a silicon layer on the plurality of silicon rods, and a GaN substrate on the silicon layer.

11 Claims, 3 Drawing Sheets

(51) Int. Cl.
*H01L 29/20* (2006.01)
*H01L 21/306* (2006.01)
*H01L 21/308* (2006.01)

(52) U.S. Cl.
CPC .... *H01L21/02491* (2013.01); *H01L 21/02502* (2013.01); *H01L 21/02532* (2013.01); *H01L 21/02592* (2013.01); *H01L 21/02639* (2013.01); *H01L 21/02647* (2013.01); *H01L 21/02658* (2013.01); *H01L 21/02667* (2013.01); *H01L 21/3081* (2013.01); *H01L 21/30604* (2013.01); *H01L 29/2003* (2013.01); *H01L 21/02255* (2013.01)

(56) References Cited

U.S. PATENT DOCUMENTS

| | | |
|---|---|---|
| 7,723,729 B2 | 5/2010 | Li et al. |
| 8,211,705 B2 | 7/2012 | Carella et al. |
| 2002/0132101 A1 | 9/2002 | Fonash et al. |
| 2004/0123796 A1 | 7/2004 | Nagai et al. |
| 2008/0171424 A1 | 7/2008 | Li et al. |
| 2009/0197416 A1 | 8/2009 | Lee et al. |
| 2009/0286063 A2 | 11/2009 | Dmitriev et al. |
| 2011/0045349 A1 | 2/2011 | Pushparaj et al. |

FOREIGN PATENT DOCUMENTS

| | | |
|---|---|---|
| KR | 2007-0115209 A | 12/2007 |
| KR | 20090012091 A | 2/2009 |
| KR | 20090094516 A | 9/2009 |
| KR | 10-1156721 B1 | 6/2012 |
| KR | 20120064713 A | 6/2012 |

OTHER PUBLICATIONS

Hiroyasu Ishikawa et al., "MOCVD growth of GaN on porous silicon substrates", Journal of Crystal Growth 310 (2008) 4900-4903.
Iruthayaraj Beaula Rowena et al., "Buffer Thickness Contribution to Suppress Vertical Leakage Current With High Breakdown Field (2.3 MV/cm) for GaN on Si", IEEE Electron Device Letters, vol. 32, No. 11, Nov. 2011, pp. 1534-1536.
Bin Li et al., "Fabrication and Characterization of Patterned Single-Crystal Silicon Nanolines", Nano Letters 2008, vol. 8, No. 1, pp. 92-98.
Yong-Jae Kim et al., "Exploring Nanomechanical Behavior of Silicon Nanowires: AFM Bending Versus Nanoindentation" Advanced Function Materials, 2011, 21, pp. 279-286.

STRUCTURE INCLUDING GALLIUM NITRIDE SUBSTRATE AND METHOD OF MANUFACTURING THE GALLIUM NITRIDE SUBSTRATE

CROSS-REFERENCE TO RELATED APPLICATIONS

This application is a divisional application of and claims priority under 35 U.S.C. §120/121 to U.S. application Ser. No. 13/848,281, filed Mar. 21, 2013, which claims the benefit of Korean Patent Application No. 10-2012-0117914, filed on Oct. 23, 2012, in the Korean Intellectual Property Office, the disclosure of each of which is incorporated herein in its entirety by reference.

BACKGROUND

1. Field

Some example embodiments relate to methods of manufacturing a gallium nitride (GaN) substrate on a silicon substrate.

2. Description of the Related Art

Gallium nitride (GaN) is a semiconductor that has bandgap energy of about 3.39 eV, and thus, GaN is used to manufacture a light-emitting device having a short wavelength. Also, GaN has a high breakdown voltage and thus is used for manufacturing a power device.

A sapphire substrate is used to manufacture a GaN substrate. The GaN substrate may be manufactured by growing a GaN layer on the sapphire substrate and then removing the sapphire substrate. However, it is difficult to prepare a sapphire substrate having a diameter equal to or higher than about 6 inches, and the sapphire substrate is expensive. Thus, it is difficult to use the sapphire substrate to manufacture a large area GaN substrate.

Accordingly, a method of growing a GaN layer using a large area silicon substrate is being developed. However, when the GaN layer is grown on the large area silicon substrate, cracks may occur in a GaN thin film and the silicon substrate, a warpage phenomenon may occur in the GaN thin film and the silicon substrate, and a uniformity of a thickness of the GaN thin film may be reduced due to differences in a thermal expansion coefficient and lattice constant between silicon and GaN.

SUMMARY

Some example embodiments provide methods of manufacturing a gallium nitride (GaN) substrate by using a silicon substrate. Some example embodiments also provide structures including a GaN substrate disposed on a silicon substrate.

Additional aspects will be set forth in part in the description which follows and, in part, will be apparent from the description, or may be learned by practice of the presented embodiments.

According to an example embodiment, a structure includes a plurality of silicon rods on a silicon substrate, a silicon layer on the plurality of silicon rods, and a gallium nitride (GaN) substrate on the silicon layer.

The plurality of silicon rods may have an aspect ratio from about 5:1 to about 20:1. Each of the plurality of silicon rods may include a silicon core and a silicon oxide shell surrounding the silicon core. Lengths of the plurality of silicon rods may be from about 2 µm to about 10 µm. A gap between the plurality of silicon rods may be from about 50 nm to about 500 nm. Widths of the plurality of silicon rods may be from about 100 nm to about 1000 nm.

The structure may further include an insulation layer pattern between the silicon layer and the GaN substrate. The structure may further include a buffer layer between the silicon layer and the GaN substrate.

According to another example embodiment, a method of manufacturing a GaN substrate includes forming a plurality of silicon rods on an upper surface of a silicon substrate by etching the silicon substrate, forming an amorphous silicon layer on the plurality of silicon rods, changing the amorphous silicon layer to a crystalline silicon layer, and growing a GaN substrate on the crystalline silicon layer.

The plurality of silicon rods may include gaps formed between the plurality of silicon rods, and the gaps have a width from about 50 nm to about 500 nm. The plurality of silicon rods may have an aspect ratio from about 5:1 to about 20:1. The plurality of silicon rods may have lengths from about 2 µm to about 10 µm. The plurality of silicon rods may have widths from about 100 nm to about 1000 nm.

The plurality of silicon rods may be formed by forming a silicon oxide layer on an upper surface of the silicon substrate by oxidizing the silicon substrate, patterning the silicon oxide layer, performing dry etching on the silicon substrate using the patterned silicon oxide layer as a mask, and removing the patterned silicon oxide layer. The plurality of silicon rods may be formed by forming silicon cores and silicon oxide shells surrounding the silicon cores by thermally oxidizing the plurality of silicon rods.

The amorphous silicon layer may be formed by one of a sputtering method and an evaporation deposition method. The amorphous silicon layer may be changed by one of an ELA method and a SPC method. The GaN substrate may be grown by forming a buffer layer on the crystalline silicon layer. The GaN substrate may be grown by forming an insulation layer pattern on the crystalline silicon layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
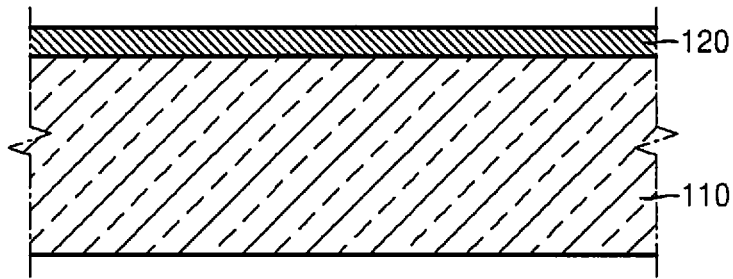
FIGS. 1A through 1F are cross-sectional views for describing a method of manufacturing a gallium nitride (GaN) substrate, according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. In drawings, thicknesses of layers or regions may be exaggerated for clarity, and when a component is disposed "on" or "above" another component, the component may be disposed directly on the other component or an intervening component may exist.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

FIGS. 1A through 1F are cross-sectional views for describing a method of manufacturing a gallium nitride (GaN) substrate, according to an example embodiment.

Referring to FIG. 1A, a large area silicon substrate 110 is prepared. The large area silicon substrate 110 may have a (111) surface. The large area silicon substrate 110 may have a thickness from about 500 µm to about 1000 µm, and a diameter from about 6 inches to 18 inches. Since a diameter of the large area GaN substrate is determined by the diameter of the large area silicon substrate 110, the large area silicon substrate 110 is prepared to manufacture the large area GaN substrate.

However, the method according to an example embodiment is not limited to using a silicon substrate having a diameter of 6 inches or above, and a small area GaN substrate may be manufactured by using a small area silicon substrate.

A hard mask layer 120 is formed on the large area silicon substrate 110. The hard mask layer 120 may be a silicon oxide layer. The silicon oxide layer may be formed by thermally oxidizing the large area silicon substrate 110. Also, the silicon oxide layer may be formed by using a chemical vapor deposition (CVD) method.

Figure 1B:
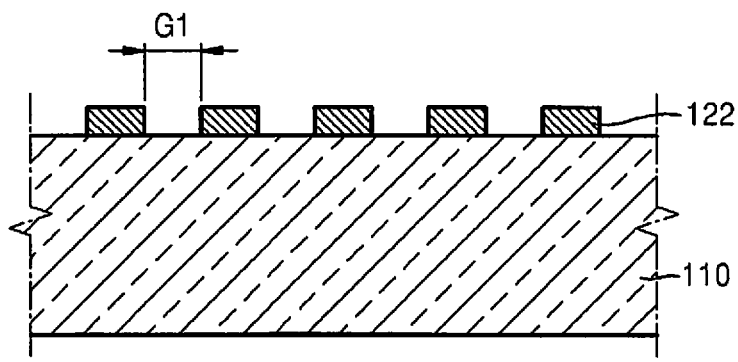

Referring to FIG. 1B, masks 122 are formed by patterning the hard mask layer 120. The masks 122 may have a variety of shapes such as rectangular shapes, circular shapes, etc. A width (or a diameter) of each of the masks 122 may be from about 100 nm to about 1000 nm. Gaps G1 between the masks 122 may be from about 50 nm to about 500 nm. If the gaps G1 between the masks 122 are smaller than 50 nm, an etching process that will be described below may be difficult to perform. If the gaps G1 between the masks 122 are greater than 500 nm, amorphous silicon permeates into the gaps G1 to fill the gaps G1 during an amorphous silicon thin film process that will be described below.

Meanwhile, to reduce the gaps G1 between the masks 122, an insulating layer (not shown) that covers the masks 122 is formed on the large area silicon substrate 110 and then spacers (not shown) may be formed at side surfaces of the masks 122 by dry etching. This method is well known in a semiconductor process, and thus a detailed description thereof is omitted.

Figure 1C:
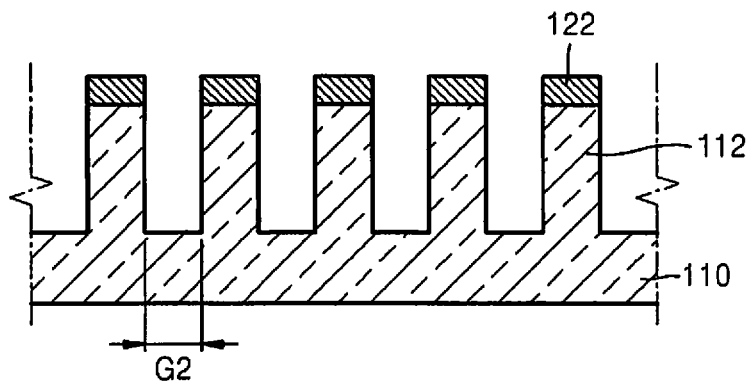

Referring to FIG. 1C, the masks 122 are used to perform dry etching on the large area silicon substrate 110. As a result, a plurality of silicon rods 112 are formed on the large area silicon substrate 110. Gaps G2 between the silicon rods 112 may be approximately the same as the gaps G1. The silicon rods 112 are referred to as a silicon rod array. A width (or a diameter) of the silicon rod 112 may be from about 100 nm to about 1000 nm, and a length thereof may be from about 2 µm to about 10 µm. The silicon rods 112 may have an aspect ratio from about 5:1 to about 20:1. The silicon rods 112 having the above size are flexible. That is, the silicon rods 112 may function as flexible springs. The masks 122 are removed by wet etching.

Figure 1D:
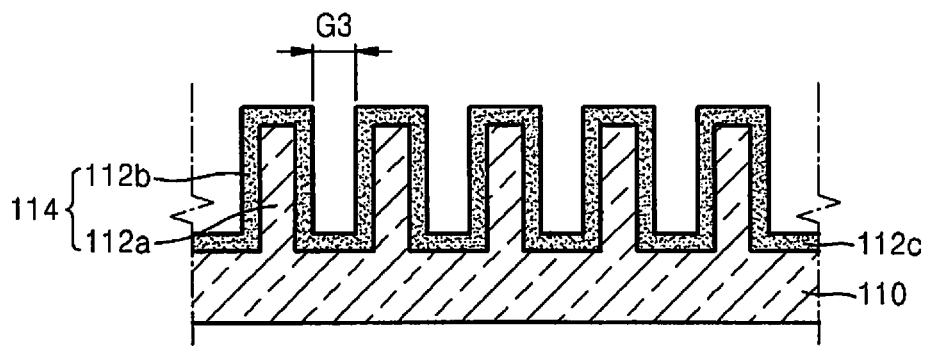

Referring to FIG. 1D, silicon cores 112a and silicon oxide shells 112b that surround the silicon cores 112a are formed by thermally oxidizing the silicon rods 112. A silicon oxide layer 112c is formed on the large area silicon substrate 110. A resultant expands in volume compared to the silicon rods 112 before being thermally processed. Thus, gaps G3 between the silicon oxide shells 112b are reduced. For descriptive convenience, the silicon cores 112a and the silicon oxide shells 112b are referred to as silicon rods 114. After the gaps G2 between the silicon rods 112 (refer to FIG. 1C) are formed relatively wide, the gaps G3 between the silicon oxide shells 112b may be reduced by the thermal oxidation process, and thus, the gaps G1 between the masks 122 may be further increased during the process of forming the masks 122. The formation of the silicon cores 112a results in a reduction in a path area of a leakage current, and thus an amount of the leakage current may be reduced.

Figure 1E:
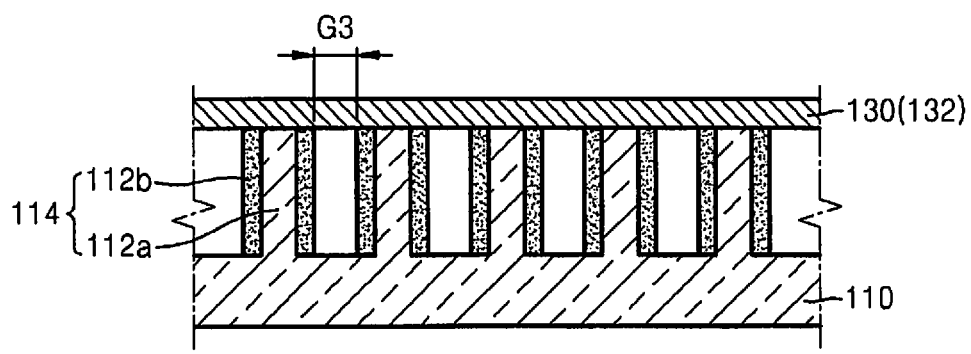

Referring to FIG. 1E, the silicon oxide shells 112b on an upper surface of the silicon cores 112a are removed by dry etching. During this dry etching, the silicon oxide layer 112c between the silicon rods 114 may be removed.

Thereafter, an amorphous silicon layer 130 is formed on an upper surface of the silicon rods 114 by sputtering polysilicon. The gaps G3 between the silicon rods 114 are relatively narrow, and thus amorphous silicon may not completely fill the gaps G3. An electron beam evaporation method may be used instead of the sputtering method.

Figure 1F:
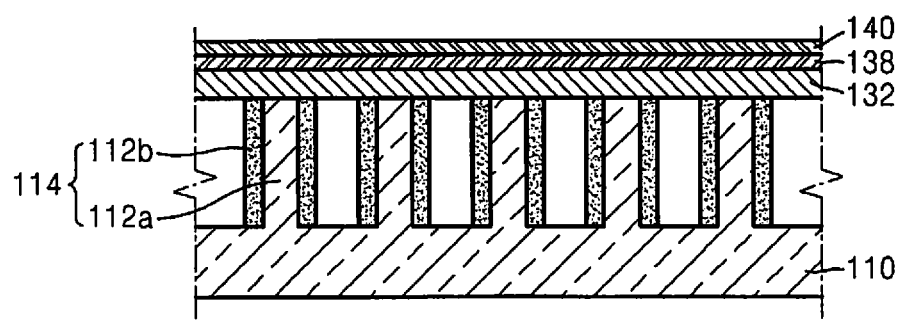

Referring to FIG. 1F, the amorphous silicon layer 130 is changed to a crystalline silicon layer 132 through a lateral epitaxial growth on the upper surface of the silicon cores 112*a* at a temperature from about 550° C. to about 600° C. using a solid-phase crystallization (SPC) method. The amorphous silicon layer 130 may be changed to the crystalline silicon layer 132 using an excimer laser annealing (ELA) method instead of the SPC method.

Before the process of changing the amorphous silicon layer 130 to the crystalline silicon layer 132, silicon ion implantation may be performed so as to remove a crystalline nucleus present in the amorphous silicon layer 130.

Thereafter, a GaN base material layer, for example, GaN layer 140, is formed on the crystalline silicon layer 132 using a method well-known to the semiconductor process.

The GaN layer 140 may be formed using a hydride vapor phase epitaxy (HVPE) method. Since GaN grows faster by using the HVPE method rather than the MOCVD method, the HVPE method may be used to grow large area and thick GaN. Gallium chloride (GaCl) is formed by reacting hydrogen chloride (HCl) and Ga metal in an HVPE reactor, and then reacting GaCl and ammonia ($NH_3$) to form the GaN layer 140. A growth temperature of the GaN layer 140 may be from about 950° C. to about 1100° C. The GaN layer 140 is also hereinafter referred to as a GaN substrate. An AlGaN layer (not shown) may be further grown on the GaN layer 140 by using the HVPE method.

A buffer layer 138 may be further formed before forming the GaN layer 140. The buffer layer 138 may be formed of any one of aluminum nitride (AlN), tantalum nitride (TaN), titanium nitride (TiN), hafnium nitride (HfN), GaN, and aluminum gallium nitride (AlGaN), or formed as a triple layer AlN/AlGaN/GaN. The buffer layer 138 is used for epitaxial growth of a GaN layer thereon.

The buffer layer 138 may be formed by using a metal organic chemical vapor deposition (MOCVD) method.

In the resultant of FIG. 1F, a water jet splitting method may be used to remove the silicon rods 114, and thus a large area GaN substrate may be obtained.

According to an example embodiment, a flexible silicon rod array is disposed between a large area silicon substrate and a GaN based substrate and absorbs most of a tensile stress during a cooling process when the GaN based substrate is grown. Cracks due to other stress are restricted to a silicon layer on silicon rods, and thus, the formation of cracks at the GaN substrate and the silicon substrate is restricted.

Further, a flexibility of silicon rods may prevent or inhibit a warpage from occurring at the GaN substrate and the silicon substrate. As a result, a high quality GaN substrate having a uniform thickness may be manufactured on a large area silicon substrate. The formation of a thick GaN layer may result in an increase in a breakdown voltage of the GaN substrate. The water jet splitting method may be used to more easily remove the silicon rod array, and thus the large area silicon wafer may be reusable.

Figure 2A:
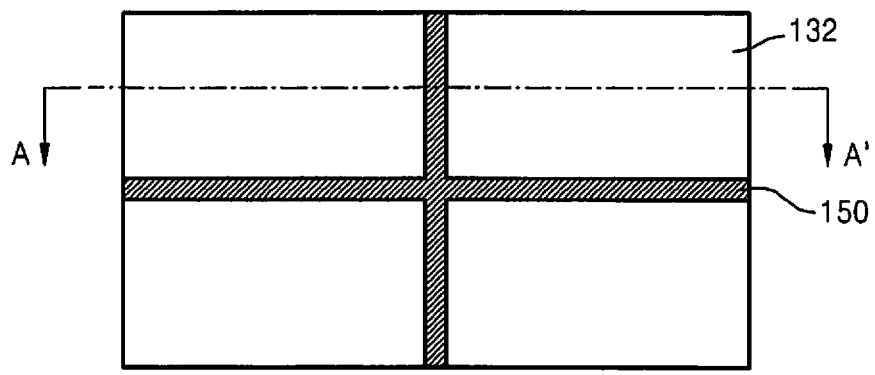
FIGS. 2A and 2B are views for describing a method of manufacturing a gallium nitride (GaN) substrate, according to another example embodiment.
Figure 2B:
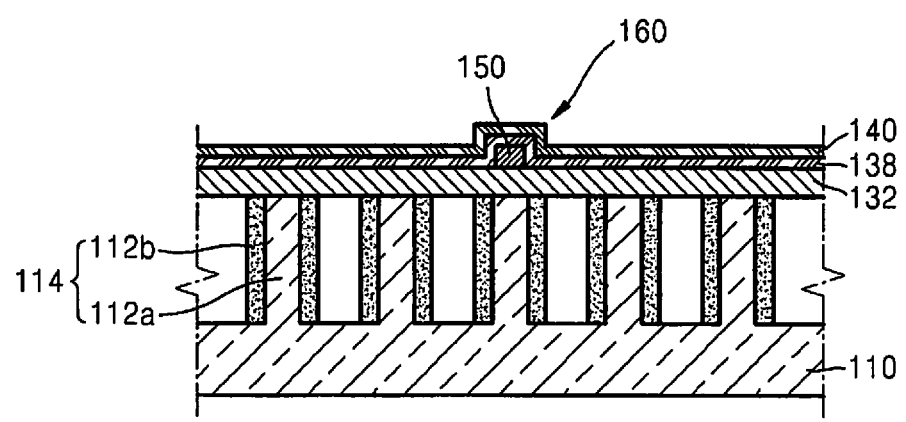

FIGS. 2A and 2B show another example embodiment. The same elements as described in the previous embodiment are denoted with the same reference numerals and detailed descriptions thereof are omitted.

FIG. 2A is a plan view. Referring to FIG. 2A, in the resultant of FIG. 1E, an insulation layer (not shown), for example, a silicon oxide layer, is deposited on the crystalline silicon layer 132. Thereafter, an insulation layer pattern 150 is formed by patterning the insulation layer.

FIG. 2B is a cross-sectional view taken from line A-A' of FIG. 2A. Referring to FIG. 2B, the buffer layer 138 that covers the insulation layer pattern 150 is formed on the crystalline silicon layer 132. The GaN layer 140 is formed on the buffer layer 138.

A portion of the buffer layer 138 and the GaN layer 140 exposed to the insulation layer pattern 150 are single crystal layers, whereas another portion of the buffer layer 138 and the GaN layer 140 on the insulation layer pattern 150 which is an amorphous layer, are polycrystalline layers 160. A GaN based device may be manufactured using the GaN layer 140 formed on the crystalline silicon layer 132.

According to another example embodiment, the GaN layer 140 having a relatively small size is formed by the insulation layer pattern 150, which reduces a tensile stress from occurring while forming a large area GaN layer. Thus, a large area GaN substrate having desirable qualities may be manufactured on a silicon substrate.

As described above, according to example embodiments, cracks caused by a tensile stress are formed on a crystalline silicon layer during a cooling process when the GaN substrate is grown on a large area silicon substrate, and thus the formation of the cracks on the GaN substrate and a silicon substrate is restrained.

Further, a higher quality GaN layer of a uniform thickness may be manufactured on the large area silicon substrate. A water jet splitting method may be used to more easily remove a silicon rod array, and thus a silicon wafer may be reusable.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing a GaN substrate, the method comprising:
    forming a plurality of silicon rods on an upper surface of a silicon substrate by etching the silicon substrate;
    forming an amorphous silicon layer on the plurality of silicon rods;
    changing the amorphous silicon layer to a crystalline silicon layer; and
    growing a GaN substrate on the crystalline silicon layer.

2. The method of claim 1, wherein the forming a plurality of silicon rods includes forming gaps between the plurality of silicon rods, the gaps having a width from about 50 nm to about 500 nm.

3. The method of claim 1, wherein the forming a plurality of silicon rods includes forming the plurality of silicon rods having an aspect ratio from about 5:1 to about 20:1.

4. The method of claim 1, wherein the forming a plurality of silicon rods includes forming the plurality of silicon rods having lengths from about 2 μm to about 10 μm.

5. The method of claim 1, wherein the forming a plurality of silicon rods includes forming the plurality of silicon rods having widths from about 100 nm to about 1000 nm.

6. The method of claim 1, wherein the forming a plurality of silicon rods comprises:
    forming a silicon oxide layer on an upper surface of the silicon substrate by oxidizing the silicon substrate;
    patterning the silicon oxide layer;
    performing dry etching on the silicon substrate using the patterned silicon oxide layer as a mask; and
    removing the patterned silicon oxide layer.

7. The method of claim 1, wherein the forming a plurality of silicon rods comprises:
    forming silicon cores and silicon oxide shells surrounding the silicon cores by thermally oxidizing the plurality of silicon rods.

8. The method of claim 1, wherein the forming an amorphous silicon layer includes one of a sputtering method and an evaporation deposition method.

9. The method of claim 1, wherein the changing the amorphous silicon layer includes one of an ELA method and a SPC method.

10. The method of claim 1, wherein the growing a GaN substrate further comprises forming a buffer layer on the crystalline silicon layer.

11. The method of claim 1, wherein the growing a GaN substrate further comprises forming an insulation layer pattern on the crystalline silicon layer.

* * * * *